United States Patent

Ito

Patent Number: 5,901,829

Date of Patent: May 11, 1999

[54] METHOD OF POSITIONING AN IC AND IC HANDLER UTILIZING SAID METHOD

[75] Inventor: Masato Ito, Matsumoto, Japan

[73] Assignee: Kabushiki Kaisha Shinano Electronics, Nagano, Japan

[21] Appl. No.: 08/809,866

[22] PCT Filed: May 29, 1996

[86] PCT No.: PCT/JP96/01455

§ 371 Date: Jul. 10, 1997

§ 102(e) Date: Jul. 10, 1997

[87] PCT Pub. No.: WO97/24913

PCT Pub. Date: Jul. 10, 1997

[30] Foreign Application Priority Data

Dec. 27, 1995 [JP] Japan .................................. 7-340343

[51] Int. Cl.⁶ .......................... B65G 15/64; B65G 21/22; B65G 47/22; B65G 47/24
[52] U.S. Cl. ........................ 198/345.1; 198/382; 198/394
[58] Field of Search .................. 198/345.1, 382, 198/390, 394

[56] References Cited

U.S. PATENT DOCUMENTS

| | | | |
|---|---|---|---|
| 3,776,394 | 12/1973 | Miller | 198/390 X |
| 4,016,968 | 4/1977 | Stelter | 198/394 |
| 5,722,527 | 3/1998 | Van Gastel et al. | 198/345.1 X |
| 5,829,571 | 11/1998 | Mizuta et al. | 198/345.1 |

*Primary Examiner*—William E. Terrell
*Assistant Examiner*—Gene O. Crawford
*Attorney, Agent, or Firm*—Birch, Stewart, Kolasch & Birch, LLP

[57] ABSTRACT

An object of the present invention is to provide a method of positioning ICs and an IC handler utilizing the method in which a vertical mechanism is not provided in a positioning mechanism. In the IC handler, a positioning wall piece encloses a table, it has two pairs of inner faces, each pair of which are facing each other, lower portions S of each pair are formed into vertical faces and mutually separated with a distance corresponding to outermost edges of the IC, upper portions T of each pair are formed into slope faces whose distance is gradually made longer in an upward direction. An elastic member elastically supports the positioning wall piece, which is capable of moving vertically. The vertical mechanism is located above the positioning mechanism and pushes the positioning wall piece downwardly so as to correspond the upper face of the table to the upper portions T when the IC is mounted on the table, and allows movement of the positioning wall piece upwardly so as to correct a horizontal deviation of the IC by the slope faces and to position the same by the vertical faces after the IC is mounted on the table.

16 Claims, 7 Drawing Sheets

METHOD OF POSITIONING AN IC AND IC
HANDLER UTILIZING SAID METHOD

FIELD OF TECHNOLOGY

The present invention relates to a method of positioning a semiconductor integrated circuit (IC), which is properly applied to an IC checker, and an IC handler utilizing said method.

BACKGROUND OF THE TECHNOLOGY

Firstly, a basic structure of a conventional IC handler will be explained. As shown in FIG. 12, in the IC handler 50, an IC, which has been stocked in a container 52 for supplying ICs, is supplied into a socket 56 of an IC checker 54 to execute tests at a normal temperature and at a high temperature. The IC handler 50 automatically sorts and accommodates the ICs checked into containers 58 for sorting ICs. The ICs are conveyed from the container 52 to the socket 56, and from the socket 56 to the containers 58 by conveying means 60 and 62.

By the way, these days ICs are higher integrated to have higher function, so they have many leads. Thus, lead pitch of ICs become finer and finer. By having fine pitch leads, the IC in the socket 56 must be supplied with high positioning accuracy.

To precisely supplying ICs into the socket 56, a method utilizing an image processing technology, which includes the steps of catching images of the conveying means and an IC, which is held by the conveying means, by a camera and processing image data thereof to supply the IC into the socket, is known. But an image processing equipment is expensive, and it takes a long time to process image data so time length for checking an IC must be long.

Then, a conventional IC handler, which has been widely used, will be explained.

A positioning mechanism 64 is provided between the supply container 52 and the socket 56. When an IC is conveyed from the container 52 to the socket 56, the IC is once positioned to supply into he socket 56. Then the IC, which has been positioned, is conveyed to and mounted onto the socket 56 by transferring means 66.

The positioning mechanism 64 of the IC handler 50, which once positions the IC before supplying the same to the socket 56, will be explained with reference to FIGS. 13–16.

The positioning mechanism 64 has following structure. The IC 70 is mounted on an upper face of a rectangular table 68.

A positioning wall piece 72 is provided to enclose the rectangular table 68, and lower portions S of two pairs of inner faces 74, 76 and 78, 80 thereof are formed into vertical faces 82, each pair of which are mutually faced and separated with a distance corresponding to outermost edges of the IC 70. On the other hand, upper portions T of each pair of the inner faces are mutually faced and formed into slope faces 84 whose distance is gradually made longer upward. Note that, there are designed clearance, whose size is designed within predetermined allowable error, between the outermost edges of the IC 70 and the vertical faces 82 of the lower portions S.

A vertical mechanism 86 includes an actuator, e.g., an air cylinder. The vertical mechanism 86 moves the table 68 in the vertical direction with respect to the positioning wall piece 72.

A conveying means 60 is capable of three-dimensionally conveying the IC 70. The conveying means 60 is capable of horizontally conveying the IC 70 to a position above the table 68. Further, the conveying means 60 is capable of moving downward to mount the IC 70 onto the upper face of the table 68. The conveying means 60 has a sucking pad 88. The IC 70 is held by the sucking pad 88.

A transferring means 66 is capable of conveying the IC 70, which has been positioned on the table 68, to a socket 56 for tests. The transferring means 66 is capable of three-dimensionally moving, and it has a sucking pad 88 for holding the IC 70 as well as the conveying means 60. Note that, the conveying means 60 may act as the transferring means 66.

Next, action of the IC handler 50 will be explained. Note that, the conveying means 60 and 62, the transferring means 66, the vertical mechanism 86 and the checker 54 are controlled by a controller, not shown, on the basis of a predetermined program.

Firstly, the table 68 is moved upward, by the vertical mechanism 86, until the upper face corresponds to the upper portions T of the inner faces 74–80 of the positioning wall piece 72.

In this state, the IC 70 is conveyed to and mounted onto the upper face of the table 68 by the conveying means 60 as shown in FIG. 13. Then the vertical mechanism 86 moves the table 68 downward until the upper face corresponds to the lower portions S of the inner faces 74–80 of the positioning wall piece 72 as shown in FIG. 14.

For example, the IC 70 is deviated distance A, leftward, with respect to the vertical face 82 of the positioning wall piece 72, as shown in FIG. 13, when the IC 70 is mounted onto the upper face of the table 68. In this case, leads 90, which constitute the outermost edge of the IC 70, come into contact with the slope face 84 of the positioning wall piece 72 with the downward movement of the table 68, so that IC 70 is horizontally moved rightward, in FIG. 13, and finally positioned between the vertical faces 82 of the positioning wall piece 72 as shown in FIG. 14.

Upon completing the positioning of the IC 70, the vertical mechanism 86 moves the table 68 upward until reaching the initial position, as shown in FIG. 15, and stops the same there. In this state, the conveying means 60 is capable of sucking the IC 70, which has been positioned on the table 68.

TECHNICAL PROBLEMS

In the IC handler 50, the vertical mechanism 86 for vertically moving the table 68 is necessary. But the structure of the vertical mechanism 86 is complex, so manufacturing efficiency is low and manufacturing cost is high. Further, since the positioning mechanism 64 is provided in a test chamber of the IC handler 50, the vertical mechanism 86 is exposed in hard environment, at high temperature and low temperature, together with the IC 70, which is tested in the hard environment. Thus, the vertical mechanism 86 must be constituted with expensive parts because it is used in such hard environment, so that its manufacturing cost must be higher.

DISCLOSURE OF THE INVENTION

An object of the present invention is to provide a method of positioning ICs and an IC handler utilizing said method in which a vertical mechanism is not provided in a positioning mechanism.

The method for positioning an IC,
in a device including:

a rectangular table wherein the IC is mounted on an upper face thereof;

a positioning wall piece enclosing the table, the positioning wall piece having two pairs of inner faces, each pair of which are facing each other, lower portions of each pair of the inner faces being formed into vertical faces and mutually separated with a distance corresponding to outermost edges of the IC, upper portions of each pair of the inner faces being formed into slope faces whose distance is gradually made longer upward; and a positioning mechanism having an elastic member for elastically supporting the positioning wall piece so as to vertically move the same with respect to the upper face of the table, the method comprising the steps of:

pushing the positioning wall piece downward against the elasticity of the elastic member by pushing means, which is located above the positioning mechanism, so as to correspond the upper face of the table to the upper portions of the inner faces when the IC is mounted on the table; and moving the positioning wall piece upward by the elasticity of the elastic member after the IC is mounted on the upper face of the table so as to correct a horizontal deviation of the IC by the slope faces and to position the same by the vertical faces.

On the other hand, the IC handler comprising a positioning mechanism, which includes:

a rectangular table wherein the IC is mounted on an upper face thereof; and a positioning wall piece enclosing the table, the positioning wall piece having two pairs of inner faces, each pair of which are faced each other, lower portions of each pair of the inner faces being formed into vertical faces and mutually separated with a distance corresponding to outermost edges of the IC, upper portions of each pair of the inner faces being formed into slope faces whose distance is gradually made longer upward, characterized in, that the positioning mechanism has an elastic member for elastically supporting the positioning wall piece so as to vertically move the same with respect to the upper face of the table, that a vertical mechanism, which is located above the positioning mechanism, pushes the positioning wall piece downward against the elasticity of the elastic member so as to correspond the upper face of the table to the upper portions of the inner faces when the IC is mounted on the table, and that the vertical mechanism allows to move the positioning wall piece upward by the elasticity of the elastic member after the IC is mounted on the upper face of the table so as to correct a horizontal deviation of the IC by the slope faces and to position the same by the vertical faces.

In the present invention, the device may further include means for conveying the IC onto the upper face of the table, wherein the conveying means pushes the positioning wall piece downward against the elasticity of the elastic member when the conveying means, which is holding the IC, is moved, downward, toward the table, and wherein the positioning wall piece is moved upward by the elasticity of the elastic member with upward movement of the conveying means after the IC is mounted on the upper face of the table.

The table may have an air path whose one end is opened in the upper face, wherein compressed air is blown off from the air path toward a rear face of the IC when the positioning wall piece is moved upward to position the IC.

First guide means, which are respectively provided at lower ends of the lower portions of the two pairs of the inner faces, may be included, wherein each first guide means has a slope face corresponding to a lower side face of a packaged section of the IC.

The device may further comprise:

transferring means capable of moving toward the IC, which has been positioned by the inner faces, with pushing the positioning wall piece downward to hold the IC; and second guide means for defining positional interrelationship between the transferring means and the positioning wall piece, whereby the positional interrelationship between the transferring means and the positioning wall piece is corrected when the positioning wall piece moves close to the second guide means.

In the present invention, the positioning wall piece is pushed downward by the pushing means or the vertical mechanism, which has been located at the position above the positioning mechanism, against the elasticity of the elastic member, when the IC is mounted onto the table. The positioning wall piece is moved upward by the elasticity of the elastic member when the pushing force is released. With this structure, horizontal deviation of the IC can be corrected by the slope faces of the positioning wall piece, and the IC can be positioned by the vertical faces thereof. Namely, no vertical mechanism, which was provided in the positioning mechanism in the conventional device, is provided in the positioning mechanism, so that the structure of the positioning mechanism can be simple, and the manufacturing cost can be reduced.

By forming the air path in the table and blowing the compressed air when the IC is positioned, the IC can be horizontally moved on the table. With this structure, stress working to leads of the IC can be reduced, so that leads can be effectively prevented from bending.

By providing the first guide means at the lower ends of the lower portions of the two pairs of inner faces, the IC can be more precisely positioned because the package section has unified shape and size.

By providing the second guide means for positioning the IC between the transferring means and the positioning wall piece, the IC can be held in a state of keeping the prescribed positional interrelationship between the transferring means and the positional wall piece, so that the IC, which has been positioned, can be held precisely. Thus, the IC can be more precisely positioned in the test socket.

BRIEF DESCRIPTION OF THE DRAWINGS

Embodiments of the present invention will now be described by way of examples and with reference to the accompanying drawings, in which.

EMBODIMENTS

Figure 1:
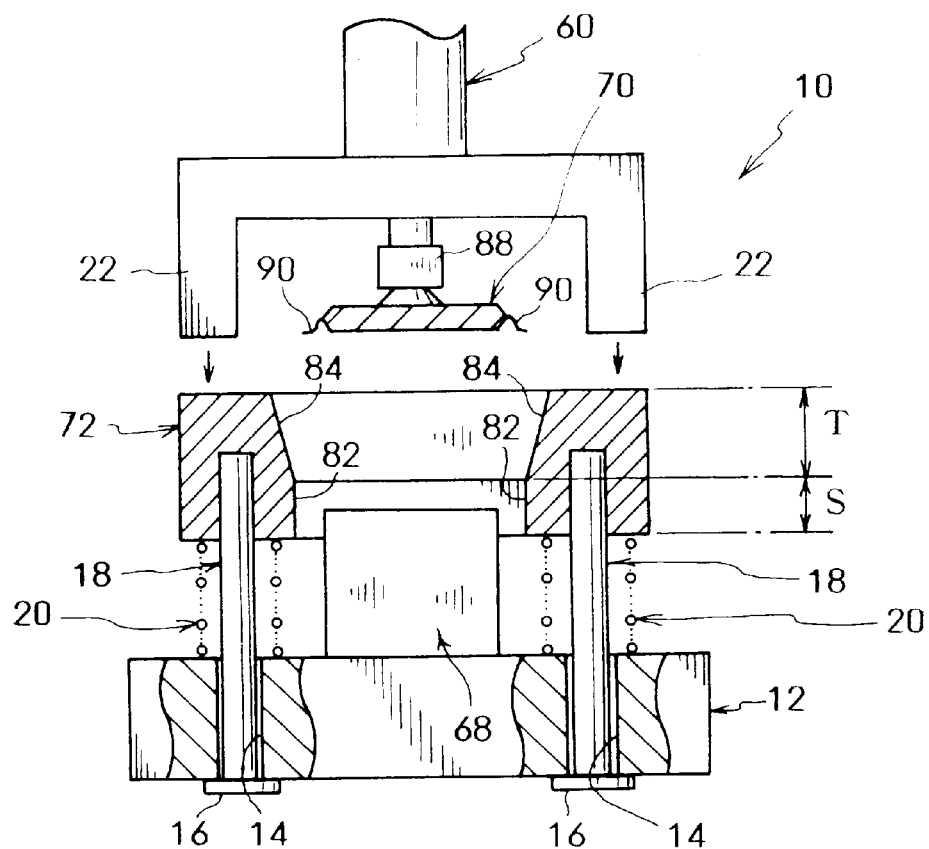
FIG. 1 is a partially cutaway side view of the positioning mechanism of the IC handler of First Embodiment of the present invention, in which the positioning wall piece is not pushed downward.

Preferred embodiments of the IC handler of the present invention will now be described in detail with reference to the accompanying drawings. Note that, elements of the IC handler explained in BACKGROUND OF THE TECHNOLOGY are assigned the same reference numerals, and explanation will be omitted.

The present invention is specifically relates to the positioning mechanism of the IC handler, so the positioning mechanism will be explained in each embodiment.

First Embodiment

Firstly, the structure of the positioning mechanism 10 of the IC handler 50 will be explained with reference to FIGS. 1–6.

The rectangular table 68 is fixed on an upper face of a base 12.

The positioning wall piece 72, which encloses the table 68, is provided above the base 12 and capable of vertically moving with respect to the base 12. The positioning wall piece 72 is prohibited to move horizontally. In the First Embodiment, there is formed vertical through-holes 14 in the base 12. Guide shafts 18, each of which has a stopper 16 at a lower end, are respectively slidably pierced through the through-holes 14 from a lower side of the base 12. The positioning wall piece 72 is fixed at upper sections of the guide shafts 18.

Coil springs 20 are an example of the elastic members. The coil springs 20 elastically support the positioning wall piece 72 above the base 12. The coil springs 20 respectively cover the guide shafts 18, and they are elastically provided between the upper face of the base 12 and the positioning wall piece 72. Thus, the stoppers 16 of the guide shafts 18 are biased to contact a bottom face of the base 12 by the elasticity of the coil springs 20 when no force pushes the positioning wall piece 72 downward. With this structure, the stoppers 16 are located at upper stroke ends.

In the present state, the upper face of the table 68 corresponds to the lower portions S of the inner faces 74–80 of the positioning wall piece 72. When the positioning wall piece 72 is pushed downward by an external force from an upper side, the upper face of the table 68 corresponds to the upper portions T of the inner faces 74–80 of the positioning wall piece 72.

Note that, the coil springs 20 may be elastically provided between the upper face of the table 68 and the bottom face of the positioning wall piece 72 without covering the guide shafts 18. And the coil springs 20 may be provided on the lower side of the guide shafts 18 so as to bias the guide shafts 18 upward. Further, a leaf spring, etc. may be employed as the elastic member instead of the coil springs 20.

As described above, no vertical mechanism having an actuator is provided in the positioning mechanism 10. And the positioning wall piece 72 is capable of vertically moving with respect to the fixed table 68.

The conveying means 60 is capable of sucking and conveying the IC 70, and it acts as the vertical mechanism as well as the conventional IC handler. The conveying means 60 has press sections 22, which come into contact with an upper face of the positioning wall piece 72 and push the same downward when the conveying means 60 is moved downward to mount the IC 70 onto the table 68.

And the transferring means 66 is also capable of sucking and conveying the IC 70 as well as the conventional IC handler. The transferring means 66 has press sections 22, which come into contact with the upper face of the positioning wall piece 72 and push the same downward when the transferring means 66 is moved downward to suck the IC 70, which has been positioned on the upper face of the table 68.

As described in BACKGROUND OF THE TECHNOLOGY, in the First Embodiment too, the conveying means 66 may act as the transferring means 66.

Successively, the action of the positioning mechanism 10 of the IC handler 50 will be explained.

Initially, the positioning wall piece 72 is lifted to a position shown in FIG. 1 by the elasticity of the coil springs 20. The upper face of the table 68 corresponds to the lower portions S of the inner faces 74–80 of the positioning wall piece 72.

In this state, the conveying means 60, which has sucked the IC 70, is moved downward to mount the IC 70 onto the upper face of the table 68. Firstly, the press section 22 of the conveying means 60 come into contact with the upper face of the positioning wall piece 72. Then the conveying means 60, which acts as the vertical mechanism, is further moved downward, so that the positioning wall piece 72 is pushed and moved downward against the elasticity of the coil sprigs 20 until reaching the position shown in FIG. 2. At that time, the upper face of the table 68 corresponds to the upper portions T of the inner faces 74–80 of the positioning wall piece 72.

Figure 2:
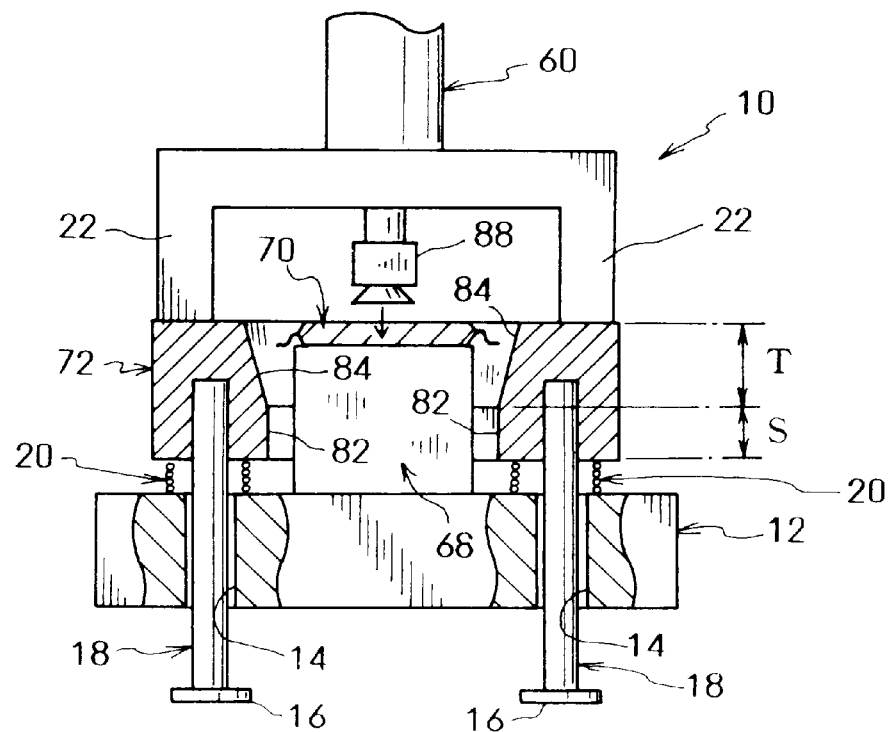
FIG. 2 is a partially cutaway side view of the the positioning wall piece shown in FIG. 1, which is pushed downward.
Figure 3:
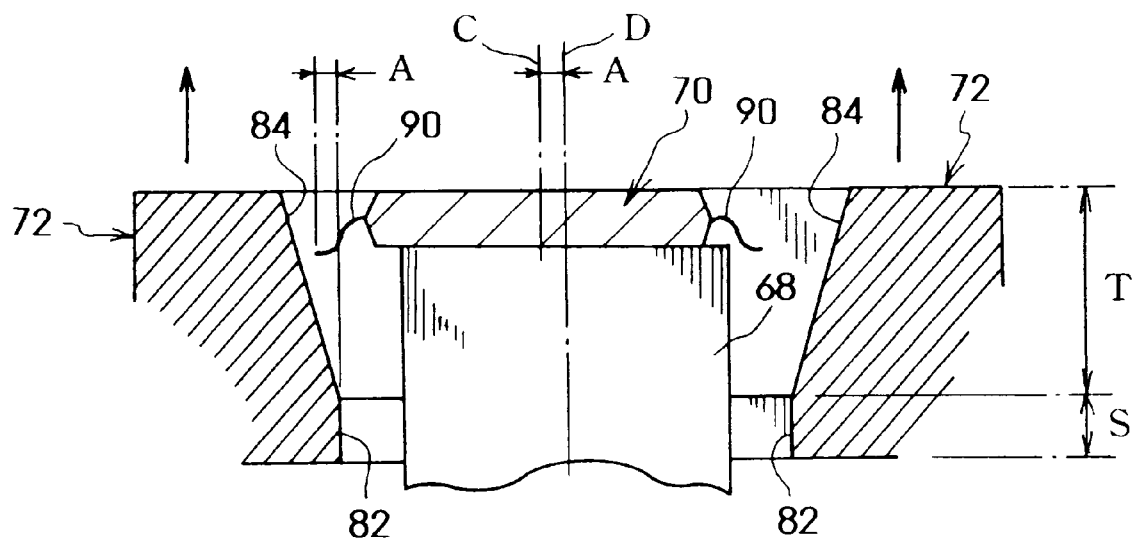
FIG. 3 is a partially enlarged view showing the table, the IC and the positioning wall piece.

Next, the conveying means 60 releases the IC 70 to mount the IC 70 on the upper face of the table 68 (see FIG. 2). Since the upper portions T of the inner faces 74–80 are formed into the slope faces 84, the leads 90, which are projected outward from side faces of the IC 70, do not contact the inner faces 74–80 of the positioning wall piece 72, so that no stress works to the leads 90.

Upon mounting the IC 70, the conveying means 60 is moved upward, then horizontally moved sideward to convey next IC 70.

Figure 4:
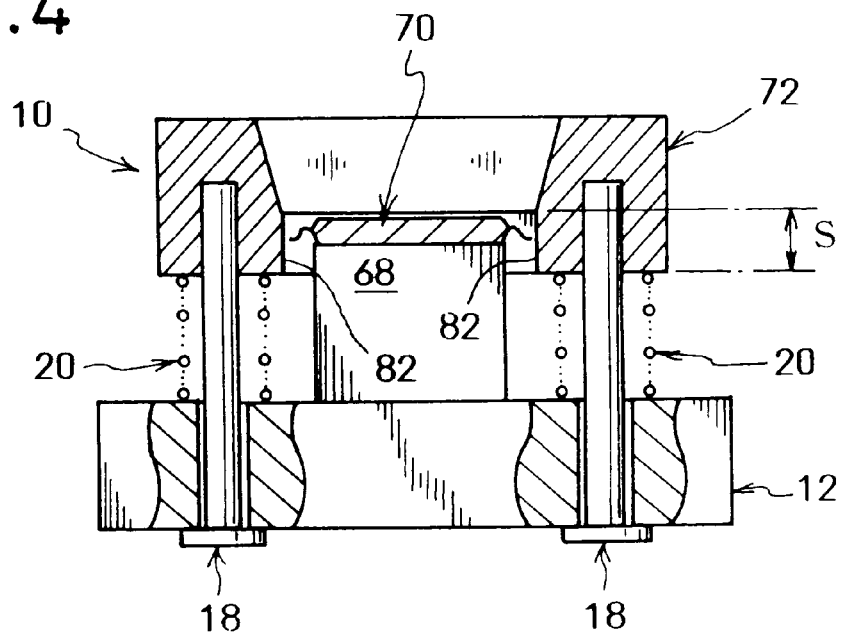
FIG. 4 is a partially cutaway side view of the the positioning wall piece, in which the positioning wall piece has been moved upward from the position shown in FIG. 2 to the initial position shown in FIG. 1, and the IC is positioned.

With the upward movement of the conveying means 60, the positioning wall piece 72, which is tightly contacted the conveying means 60 by the elasticity of the coil springs 20, is moved upward until reaching the position shown in FIG. 4 (or FIG. 1). While the upward movement, if a center C of the IC 70 mounted on the upper face of the table 68 is, for example, horizontally deviated length A from a desired center D (a center of a rectangular plane enclosed by the vertical faces 82 of the inner faces 74–80), the leads 90 of the IC 70 come into contact with the slope face 84 of the positioning wall piece 72 moving upward, and the IC 70 is horizontally pushed toward the center D. With this action, the IC 70 is finally positioned between the vertical faces 82 of the lower portions S of the inner faces 74–80 as shown in FIG. 4. The center C of the IC 70 can be located in an allowable area with respect to the prescribed desired center D.

Figure 5:
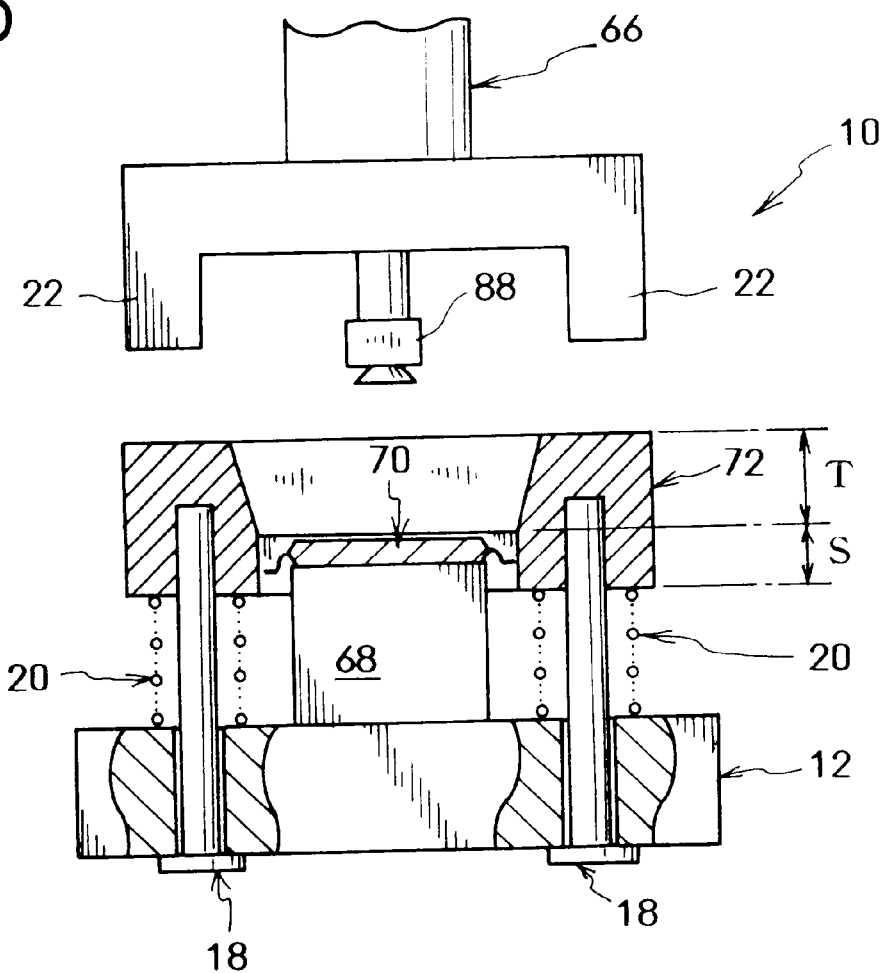
FIG. 5 is a partially cutaway side view of the the positioning wall piece, in which the IC in the state of FIG. 4 will be sucked.
Figure 6:
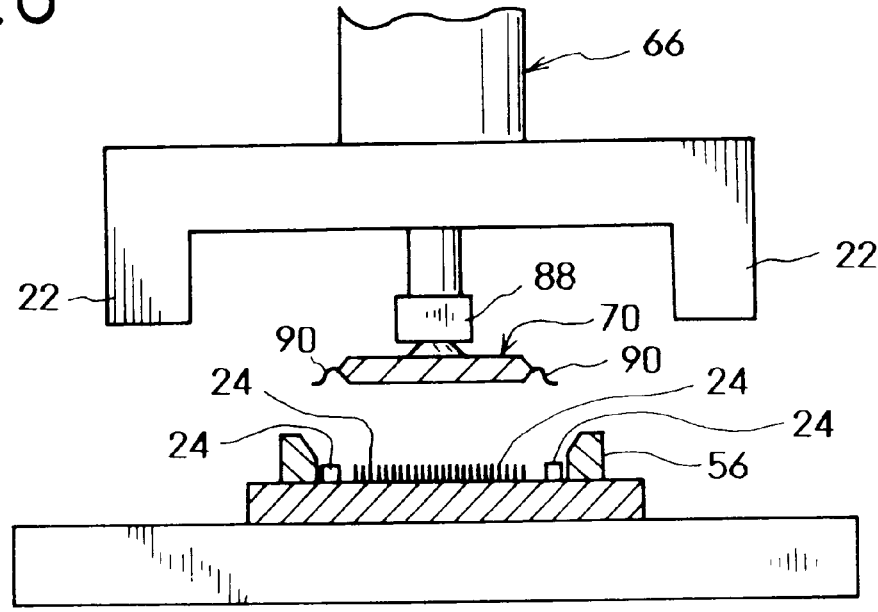
FIG. 6 is a partially cutaway side view of the the positioning wall piece, in which the IC sucked by the transferring means will be mounted onto the test socket.

Next, the transferring means 66 horizontally moves to a position above the table 68 as shown in FIG. 5, then it moves downward so as to push the positioning wall piece 72 downward. If the IC 70 on the table 68 corresponds to the upper portions T of the inner faces 74–80 of the positioning wall piece 72, the transferring means 66 stops the downward movement to suck the IC 70 by its sucking pad 88. By this sucking action, the transferring means 66 is always capable of holding the IC 70, which has been positioned at a prescribed position on the upper face of the table 68. Thus, the IC 70 can be correctly mounted on the socket 56 without deviating the leads 90 of the IC 70 from contact points 24 of the socket 56 as shown in FIG. 6.

Second Embodiment

Figure 7:
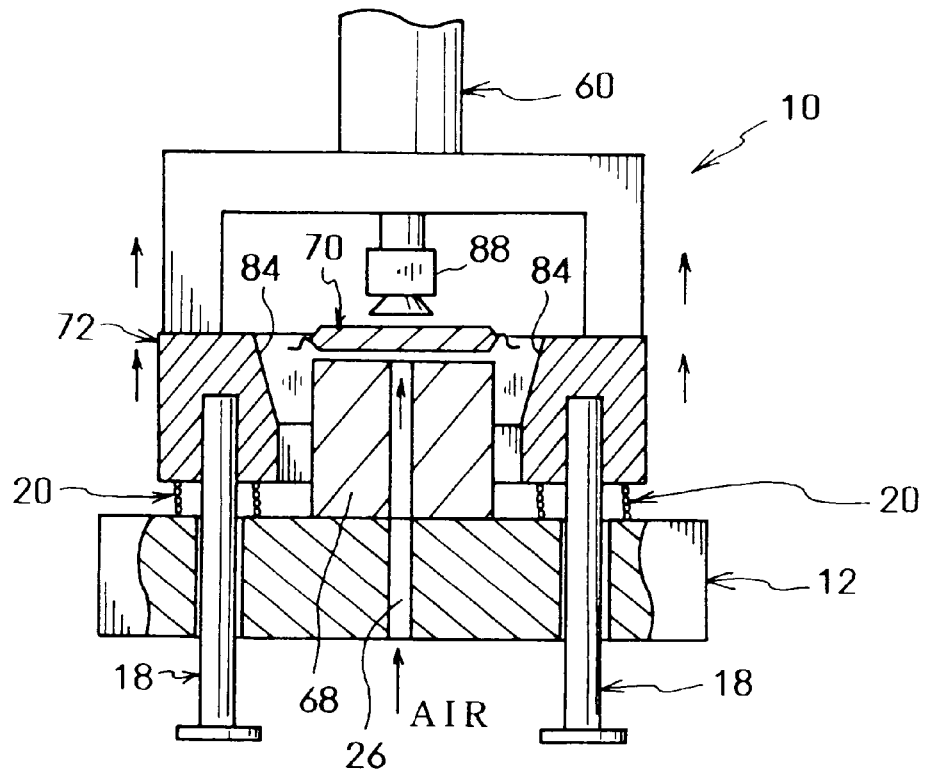
FIG. 7 is a partially cutaway side view of the positioning mechanism of Second Embodiment.

The positioning mechanism 10 of Second Embodiment will be explained with reference to FIG. 7. Note that, elements explained in the First Embodiment are assigned the same reference numerals and explanation will be omitted.

In the Second Embodiment, there is formed an air path 26, whose one end is opened in the upper face of the table on which the IC 70 is mounted, in the table 68. Compressed air is introduced into the air path 26 from a compressor, not shown. Note that, the air path 26 is also formed in the base 12 in the Second Embodiment, but the compressed air may be introduced via an air path formed in side wall of the table 68 without passing the air path in the base 12.

Successively, the action of the positioning mechanism 10 will be explained.

Basic action is the same as that of the First Embodiment. But, in the Second Embodiment, the compressor sends the compressed air into the air path 26 when the positioning wall piece 72 is moved upward to position the IC 70 on the upper face of the table 68.

By introducing the compressed air into the air path 26 when the IC 70 is positioned, the compressed air goes into a space between the upper face of the table 68 and the bottom (rear) face of the IC 70, so that the IC 70 is floated slightly. Thus, friction between the upper face of the table 68 and the bottom face of the IC 70 is reduced, so that the IC 70 can be moved smoothly. By reducing the friction, stress from the slope face 84 of the positioning wall piece 72, which works to the leads 90 of the IC 70, can be reduced, so that the leads 90 can be prevented from bending.

Third Embodiment

Figure 8:
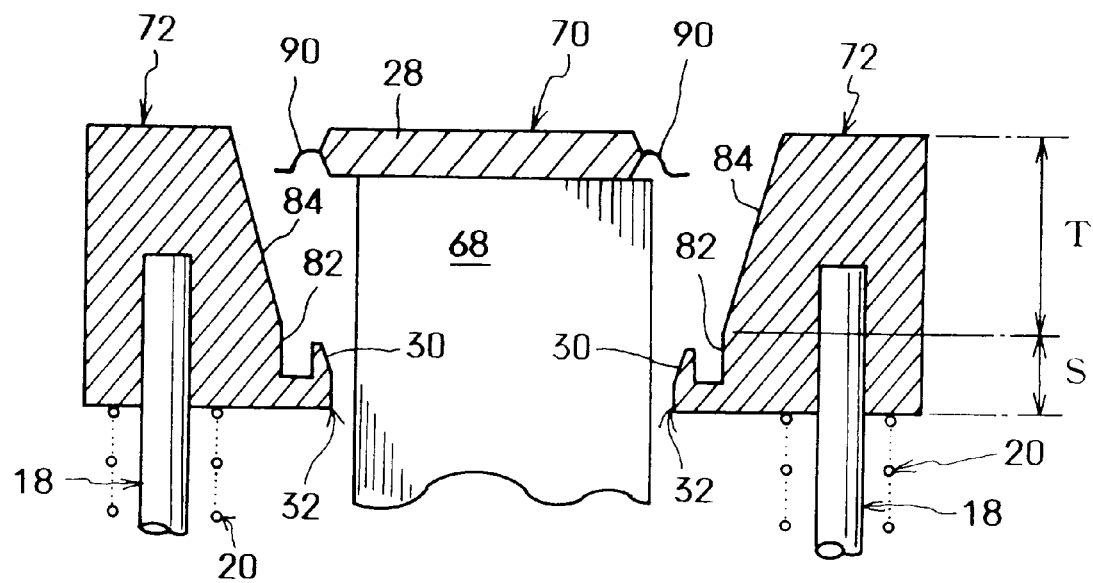
FIG. 8 is a partially enlarged sectional view of the positioning mechanism of Third Embodiment.

The positioning mechanism 10 of Third Embodiment will be explained with reference to FIGS. 8 and 9. Note that, elements explained in the First Embodiment are assigned the same reference numerals and explanation will be omitted.

In the Third Embodiment, L-shaped first guides 32 are respectively provided at lower ends of the lower portions S of the two pairs of the inner faces 74–80 of the positioning wall piece 72, and each of them has a slope face 30 corresponding to a lower side face of the packaged section 28 of the IC 70.

Generally, in the IC 70 having the plastic package section, sides of the package section 28 are formed into slope faces, which extend from the upper face and the bottom face of the package section 28 to center parts of the sides thereof from which the leads 90 are projected. A shape and sizes of the package section 28 are standardized.

In the Third Embodiment, the slope faces 30 of the first guides 32 which face each other are faced to the table 68, and separation there between is gradually longer toward upper ends. The IC 70, which is held between the first guides 32, can be positioned correctly.

Next, positioning action will be explained. Note that, basic action is the same as that of the First Embodiment, so different action will be explained.

The positioning wall piece 72 is moved upward together with the conveying means 60 after the IC 70 is mounted on the table 68. At that time, the IC 70 is horizontally moved by the slope faces 84 of the inner faces 74–80 of the positioning wall piece 72, and finally the IC 70 is correctly positioned by the vertical faces 82 of the inner faces 74–80.

Figure 9:
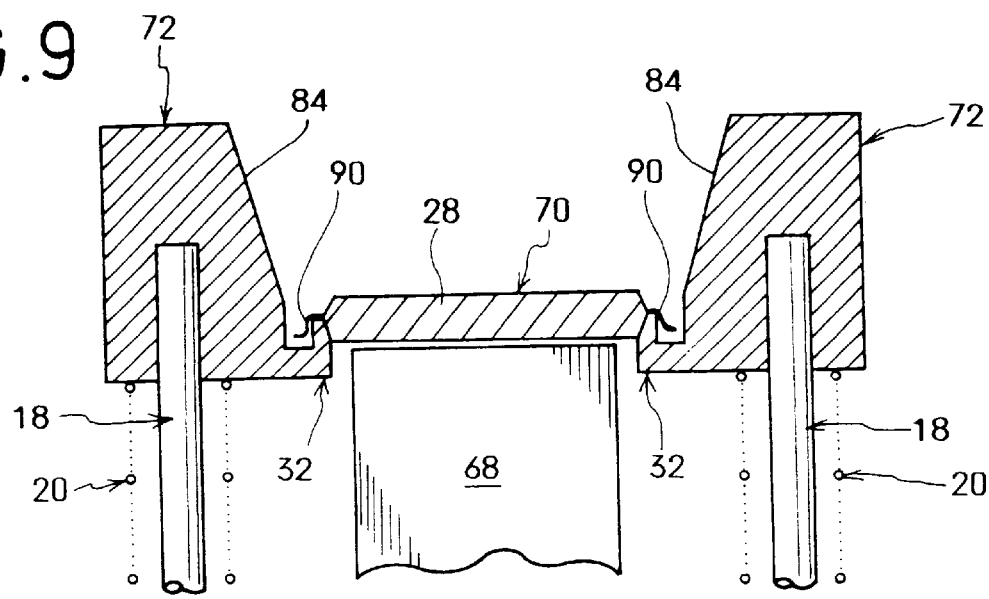
FIG. 9 is a partially enlarged sectional view showing a state of positioning the IC by the first guide means shown in FIG. 8.
Figure 15:
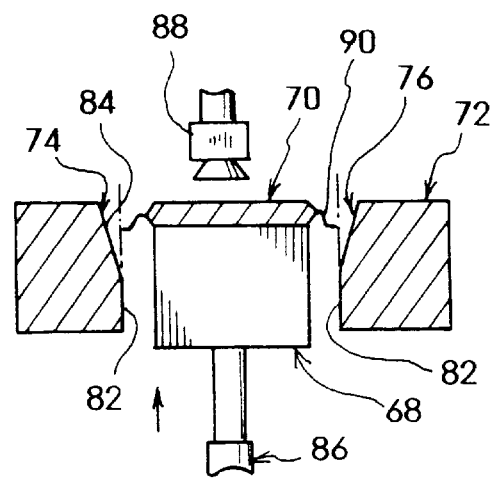
FIG. 15 is an explanation view showing a state of moving the table, which is shown in FIG. 14, upward to suck the IC by a sucking pad.
Figure 16:
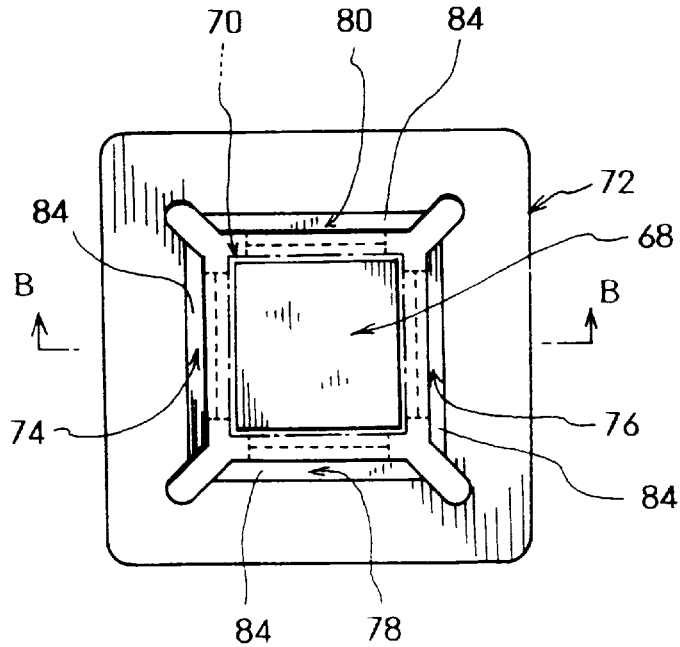
FIG. 16 is a plan view of the table and the positioning wall piece shown in FIG. 13.

Afterwards the IC 70, which has been located between the vertical faces 82, comes into contact with the first guides 32 while the positioning wall piece 72 is moved to its upper stroke end (the position shown in FIGS. 1 and 9 at which the conveying means 60 does not contact the positioning wall piece 72). By the contact, the lower side faces of the package section 28 of the IC 70 come into contact with the contact faces 30 of the first guides 32, which face to the table 68, so that the IC 70 can be precisely positioned again.

Fourth Embodiment

Figure 10:
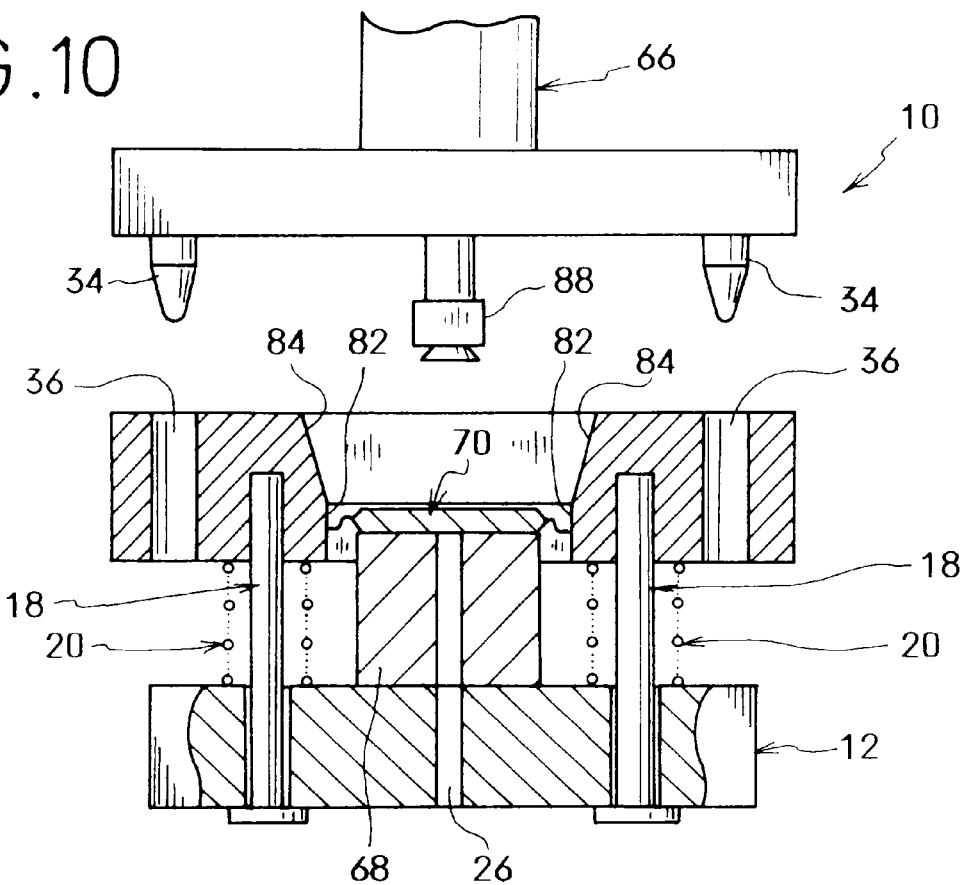
FIG. 10 is a partially enlarged sectional view of the positioning mechanism of Fourth Embodiment.
Figure 11:
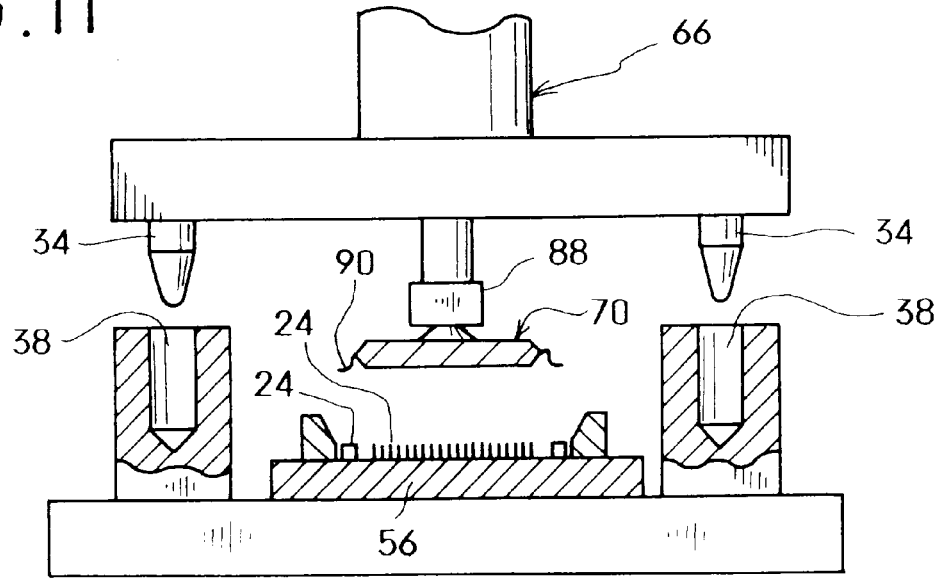
FIG. 11 is a partially enlarged sectional view showing guide pins of the transferring means shown in FIG. 10 and guide holes, into which the guide pins can be fitted, of the test socket.
Figure 12:
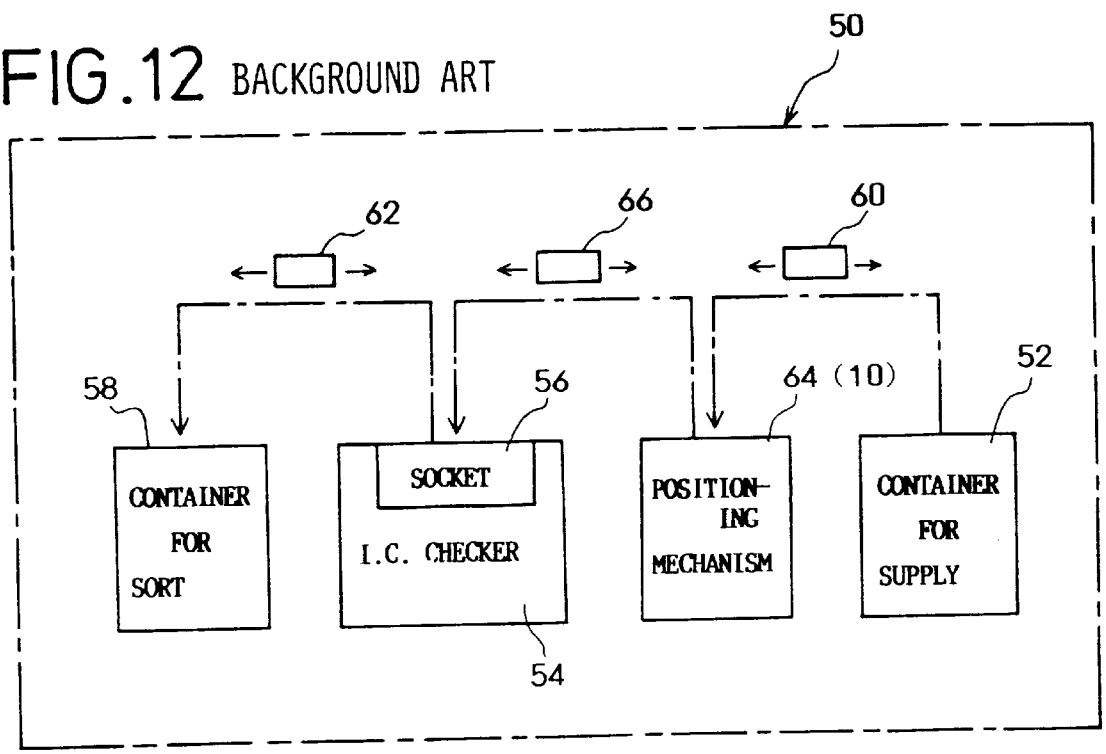
FIG. 12 is a block diagram showing a basic constitution of the conventional IC handler.
Figure 13:
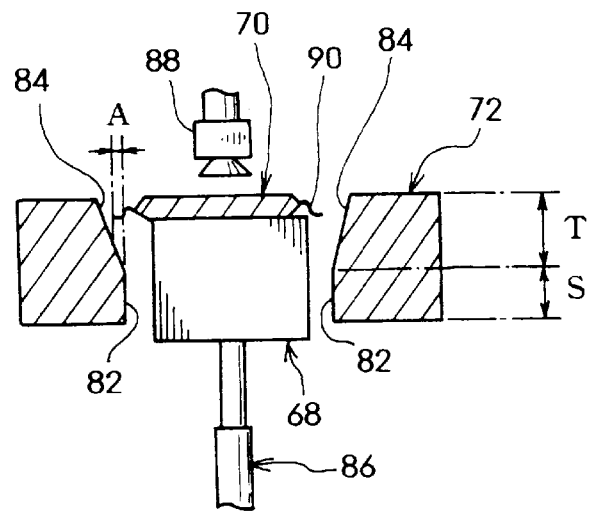
FIG. 13 is a sectional view of the positioning mechanism of the conventional IC handler taken along a line B—B of FIG. 16, in which the IC has just mounted on the table.
Figure 14:
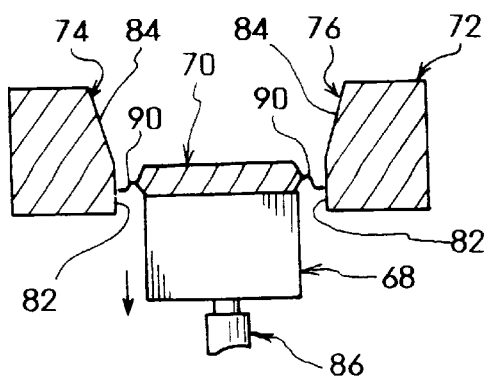
FIG. 14 is an explanation view showing a state of moving the table, which is shown in FIG. 13, downward to position the IC.

The positioning mechanism 10 of Fourth Embodiment will be explained with reference to FIG. 10. Note that, elements explained in the First Embodiment are assigned the same reference numerals and explanation will be omitted.

In the Fourth Embodiment, second guide means are provided in the upper face of the positioning wall face 72 and on a bottom face of the transferring means 66, and they define relative positional interrelationship between the both. The second guide means is constituted by guide pins 34, which are projected from the bottom face of the transferring means 60, and guide holes 36, which are opened in the upper face of the positioning wall piece 72 and into which the guide pins 34 are respectively fitted. Note that, the guide holes 36 may be formed in the transferring means 66; the guide pins 34 may be projected from the upper face of the positioning wall piece.

By the guide pins 34 and the guide holes 36, undesirable movement of the transferring means 66, which occurs when said means holds the IC 70, can be prevented. Thus, the horizontal positional interrelationship between the transferring means 66 and the positioning wall piece 72 can be always kept while holding the IC 70. By keeping the positional interrelationship between the both, the IC 70 can be more precisely positioned onto the socket 56.

Further, the socket 56 has guide holes 38 into which the guide pins 34 of the transferring means 66 fitted. Positional interrelationship between the guide holes 38 and a center of the socket 56 corresponds to that between the guide holes 36 of the positioning wall piece 72 and the center D of the positioning wall piece 72.

With this structure, undesirable movement of the transferring means 66, which occurs when the IC 70 is mounted on the socket 56, can be prevented, so that the IC 70 can be precisely set on the socket 56.

Preferred embodiments of the present invention have been described above, but the present invention is not limited to the above described embodiments, so modification can be allowed without spirit and scope of the invention.

I claim:

1. A method for positioning an IC,
    in a device including:
        a rectangular table wherein the IC is mounted on an upper face thereof;
        a positioning wall piece enclosing said table, said positioning wall piece having two pairs of inner faces, each pair of which are faced each other, lower portions of each pair of the inner faces being formed into vertical faces and mutually separated with a distance corresponding to outermost edges of the IC, upper portions of each pair of the inner faces being formed into slope faces whose distance is gradually made longer upward; and
        a positioning mechanism having an elastic member for elastically supporting said positioning wall piece so as to vertically move the same with respect to the upper face of said table,
    said method comprising the steps of:
        pushing said positioning wall piece downward against the elasticity of said elastic member by pushing means, which is located above said positioning mechanism, so as to correspond the upper face of said table to the upper portions of the inner faces when the IC is mounted on said table; and
        moving said positioning wall piece upward by the elasticity of said elastic member after the IC is mounted on the upper face of said table so as to correct a horizontal deviation of the IC by the slope faces and to position the same by the vertical faces.

2. The method according to claim 1,
    wherein said device further includes means for conveying the IC onto the upper face of said table,
    wherein said conveying means pushes said positioning wall piece downward against the elasticity of said elastic member when said conveying means, which is holding the IC, is moved, downward, toward said table, and
    wherein said positioning wall piece is moved upward by the elasticity of said elastic member with upward movement of said conveying means after the IC is mounted on the upper face of said table.

3. The method according to claim 1,
    wherein said table has an air path whose one end is opened in the upper face, and
    wherein compressed air is blown off from the air path toward a rear face of the IC when said positioning wall piece is moved upward to position the IC.

4. The method according to claim 2,
    wherein said table has an air path whose one end is opened in the upper face, and
    wherein compressed air is blown off from the air path toward a rear face of the IC when said positioning wall piece is moved upward to position the IC.

5. The method according to claim 1 or 2,
    wherein said device further includes first guide means, which are respectively provided at lower ends of the lower portions of the two pairs of the inner faces, each first guide means has a slope face corresponding to a lower side face of a packaged section of the IC.

6. The method according to claim 3 or 4,
    wherein said device further includes first guide means, which are respectively provided at lower ends of the lower portions of the two pairs of the inner faces, each first guide means has a slope face corresponding to a lower side face of a packaged section of the IC.

7. The method according to claim 1 or 2,
    wherein said device further includes:
        transferring means capable of moving toward the IC, which has been positioned by the inner faces, with pushing said positioning wall piece downward to hold the IC; and
        second guide means for defining positional interrelationship between said transferring means and said positioning wall piece,
    whereby the positional interrelationship between said transferring means and said positioning wall piece is corrected when said positioning wall piece moves close to said second guide means.

8. The method according to claim 3 or 4,
    wherein said device further includes:
        transferring means capable of moving toward the IC, which has been positioned by the inner faces, with pushing said positioning wall piece downward to hold the IC; and
        second guide means for defining positional interrelationship between said transferring means and said positioning wall piece,
    whereby the positional interrelationship between said transferring means and said positioning wall piece is corrected when said positioning wall piece moves close to said second guide means.

9. An IC handler comprising a positioning mechanism,
    which includes:
        a rectangular table wherein the IC is mounted on an upper face thereof; and
        a positioning wall piece enclosing said table, said positioning wall piece having two pairs of inner faces, each pair of which are faced each other, lower portions of each pair of the inner faces being formed into vertical faces and mutually separated with a distance corresponding to outermost edges of the IC, upper portions of each pair of the inner faces being formed into slope faces whose distance is gradually made longer upward,
    characterized in,
        that said positioning mechanism has an elastic member for elastically supporting said positioning wall piece so as to vertically move the same with respect to the upper face of said table,
        that a vertical mechanism, which is located above said positioning mechanism, pushes said positioning wall piece downward against the elasticity of said elastic member so as to correspond the upper face of said table to the upper portions of the inner faces when the IC is mounted on said table, and that said vertical mechanism allows to move said positioning wall piece upward by the elasticity of said elastic member after the IC is mounted on the upper face of said table so as to correct a horizontal deviation of the IC by the slope faces and to position the same by the vertical faces.

10. The IC handler according to claim 9, wherein said vertical mechanism is means for conveying the IC onto the upper face of said table, wherein said conveying means pushes said positioning wall piece downward against the elasticity of said elastic member when said conveying means, which is holding the IC, is moved, downward, toward said table, and wherein said positioning wall piece is moved upward by the elasticity of said elastic member with upward movement of said conveying means after the IC is mounted on the upper face of said table.

11. The IC handler according to claim 9, wherein said table has an air path whose one end is opened in the upper face, and wherein compressed air is blown off from the air path toward a rear face of the IC when said positioning wall piece is moved upward to position the IC.

12. The IC handler according to claim 10, wherein said table has an air path whose one end is opened in the upper face, and wherein compressed air is blown off from the air path toward a rear face of the IC when said positioning wall piece is moved upward to position the IC.

13. The IC handler according to claim 9 or 10, further comprising first guide means, which are respectively provided at lower ends of the lower portions of the two pairs of the inner faces, each first guide means has a slope face corresponding to a lower side face of a packaged section of the IC.

14. The IC handler according to claim 11 or 12, further comprising first guide means, which are respectively provided at lower ends of the lower portions of the two pairs of the inner faces, each first guide means has a slope face corresponding to a lower side face of a packaged section of the IC.

15. The IC handler according to claim 9 or 10, further comprising:

transferring means capable of moving toward the IC, which has been positioned by the inner faces, with pushing said positioning wall piece downward to hold the IC; and second guide means for defining positional interrelationship between said transferring means and said positioning wall piece, whereby the positional interrelationship between said transferring means and said positioning wall piece is corrected when said positioning wall piece moves close to said second guide means.

16. The IC handler according to claim 11 or 12, further comprising:

transferring means capable of moving toward the IC, which has been positioned by the inner faces, with pushing said positioning wall piece downward to hold the IC; and second guide means for defining positional interrelationship between said transferring means and said positioning wall piece, whereby the positional interrelationship between said transferring means and said positioning wall piece is corrected when said positioning wall piece moves close to said second guide means.

* * * * *